US012614582B2

(12) United States Patent
Aoki et al.

(10) Patent No.: US 12,614,582 B2
(45) Date of Patent: Apr. 28, 2026

(54) SEMICONDUCTOR STORAGE DEVICE

(71) Applicant: Kioxia Corporation, Tokyo (JP)

(72) Inventors: Takeshi Aoki, Kanagawa (JP);
Masaharu Wada, Kanagawa (JP);
Takayuki Miyazaki, Tokyo (JP);
Takashi Inukai, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 124 days.

(21) Appl. No.: 18/582,433

(22) Filed: Feb. 20, 2024

(65) Prior Publication Data

US 2024/0282359 A1    Aug. 22, 2024

(30) Foreign Application Priority Data

Feb. 22, 2023    (JP) .................................. 2023-026121

(51) Int. Cl.
*G11C 11/408*      (2006.01)
*G11C 11/4091*     (2006.01)
*G11C 11/4096*     (2006.01)

(52) U.S. Cl.
CPC ...... *G11C 11/4087* (2013.01); *G11C 11/4091* (2013.01); *G11C 11/4096* (2013.01)

(58) Field of Classification Search
CPC ............ G11C 11/4087; G11C 11/4091; G11C 11/4096
USPC ................................................... 365/230.06
See application file for complete search history.

(56) References Cited

U.S. PATENT DOCUMENTS

| | | | |
|---|---|---|---|
| 10,950,292 B1 | 3/2021 | Seyedzadehdelcheh et al. | |
| 2009/0013148 A1* | 1/2009 | Eggleston .............. | G11C 29/76 |
| | | | 711/E12.078 |
| 2020/0159674 A1* | 5/2020 | Morgan .............. | G06F 12/0238 |
| 2022/0189532 A1 | 6/2022 | Nale et al. | |
| 2022/0197740 A1 | 6/2022 | Rooney et al. | |

OTHER PUBLICATIONS

JEDEC Solid State Technology Association. "JESD79-5." DDR5 Specification (Jul. 2020).
Nagai, Takeshi, et al. "A 65nm low-power embedded DRAM with extended data-retention sleep mode." 2006 IEEE International Solid State Circuits Conference—Digest of Technical Papers. IEEE, Feb. 2006.

(Continued)

*Primary Examiner* — Anthan Tran
(74) *Attorney, Agent, or Firm* — Foley & Lardner LLP

(57)                ABSTRACT

A memory includes a cell array including first and second sub arrays including memory cells and simultaneously driven in a read or a write operation. First lines are connected to the cells corresponding to one of physical rows, where the physical row is the cells arranged in a first direction in the cell array. Second lines are connected to the cells arranged in a second direction intersecting with the first direction in the cell array. A decoder selects a selection line from among the first lines in accordance with a logical row address corresponding to each of the physical rows and applies a read voltage or a write voltage to the selection line. A sense amplifier detects data from the second lines. Logical row addresses corresponding to physical rows adjacent to a certain physical row among the physical rows differ between the first sub array and the second sub array.

14 Claims, 10 Drawing Sheets

(56) References Cited

OTHER PUBLICATIONS

Y. Jiang, H. Zhu, H. Shan, X. Guo, X. Zhang and Y. Jin, "TRRScope: Understanding Target Row Refresh Mechanism for Modern DDR Protection," 2021 IEEE International Symposium on Hardware Oriented Security and Trust (HOST), Dec. 2021, pp. 239-247, doi: 10.1109/HOST49136.2021.9702274.

* cited by examiner

1

Sub1

Sub2

Sub1

Sub2

Sub1

Sub2

1

| Sin | Sout | |
|---|---|---|
| | MUX 1 | MUX 2 |
| 00 | 0001 | 0100 |
| 01 | 0010 | 1000 |
| 10 | 0100 | 0001 |
| 11 | 1000 | 0010 |

FIG. 8

| | SubA (DQ0) | SubB (DQ1) | SubC (DQ2) | SubD (DQ3) | SubE (DQ4) | SubF (DQ5) | SubG (DQ6) | SubH (DQ7) |
|------|------|------|------|------|------|------|------|------|
| WL0 | 7 | 7 | 7 | 7 | 7 | 7 | 7 | 7 |
| WL1 | 6 | 4 | 2 | 0 | 6 | 4 | 2 | 0 |
| WL2 | 5 | 5 | 5 | 5 | 5 | 5 | 5 | 5 |
| WL3 | 4 | 2 | 0 | 6 | 4 | 2 | 0 | 6 |
| WL4 | 3 | 3 | 3 | 3 | 3 | 3 | 3 | 3 |
| WL5 | 2 | 0 | 6 | 4 | 2 | 0 | 6 | 4 |
| WL6 | 1 | 1 | 1 | 1 | 1 | 1 | 1 | 1 |
| WL7 | 0 | 6 | 4 | 2 | 0 | 6 | 4 | 2 |

FIG. 12

SEMICONDUCTOR STORAGE DEVICE

CROSS REFERENCE TO RELATED APPLICATIONS

This application is based upon and claims the benefit of priority from the prior Japanese Patent Application No. 2023-026121, filed on Feb. 22, 2023, the entire contents of which are incorporated herein by reference.

FIELD

The embodiments of the present invention relate to a semiconductor storage device.

BACKGROUND

When data is read from or written into a memory cell array in a semiconductor storage device such as a DRAM (Dynamic Random Access Memory), there is a case where memory cells connected to word lines adjacent to a selected word line are disturbed due to interference between word lines adjacent to each other. If data in many memory cells has an error due to such disturbance, there is a problem that data correction with an ECC (Error Correction Code) becomes difficult.

BRIEF DESCRIPTION OF THE DRAWINGS

FIG. 8 is an example of a truth value table of an input signal and an output signal of each of the multiplexers;

FIG. 12 is a table illustrating a correspondence relation between word lines and logical row addresses of the sub arrays according to the fourth embodiment.

DETAILED DESCRIPTION

Figure 1:
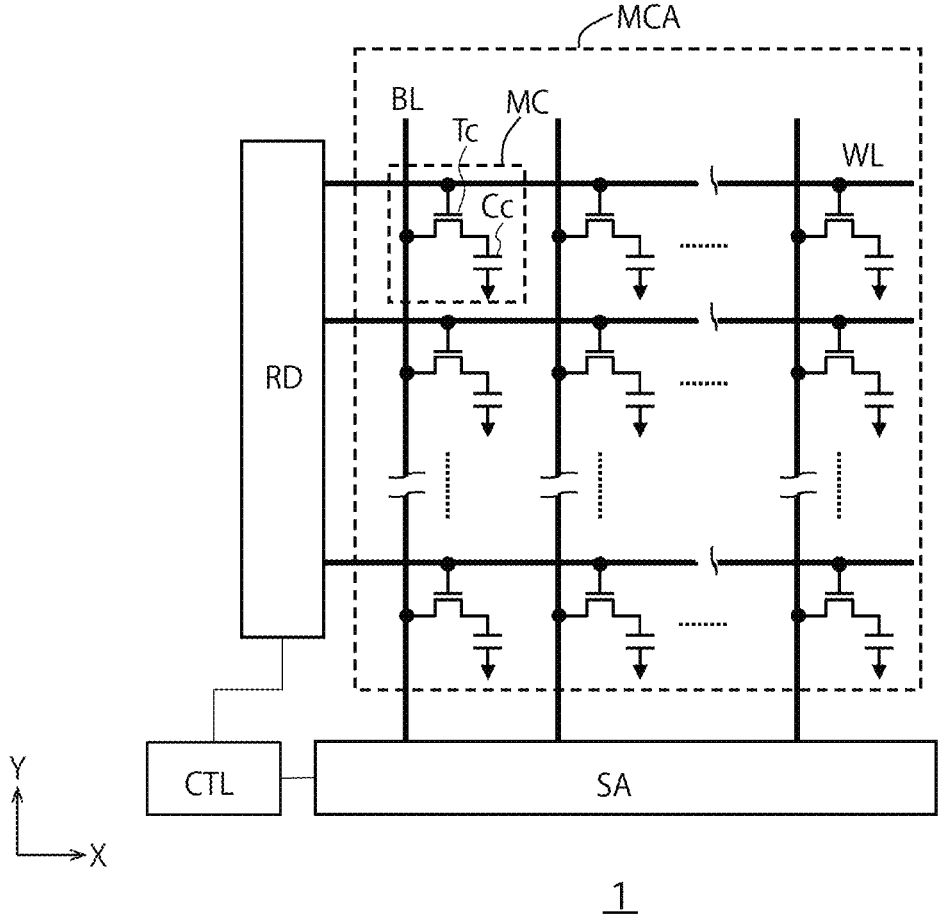
FIG. 1 is a diagram illustrating a configuration example of a semiconductor storage device according to a first embodiment.

A semiconductor storage device according to the present embodiment includes a memory cell array including first and second sub arrays each including a plurality of memory cells and simultaneously driven in a read operation or a write operation. A plurality of first lines are each connected to the plurality of memory cells corresponding to one of a plurality of physical rows, where the physical row is the memory cells arranged in a first direction in the memory cell array. A plurality of second lines are each connected to the plurality of memory cells arranged in a second direction intersecting with the first direction in the memory cell array. A decoder selects a selection line from among the first lines in accordance with a logical row address corresponding to each of the physical rows and applies a read voltage or a write voltage to the selection line. A sense amplifier detects data from the second lines. Logical row addresses corresponding to physical rows adjacent to a certain physical row among the plural physical rows differ between the first sub array and the second sub array. Hereinafter, devices of the present disclosure will be described with reference to the drawings.

The present invention is not limited to the embodiments. In the present specification and the drawings, elements identical to those described in the foregoing drawings are denoted by like reference characters and detailed explanations thereof are omitted as appropriate.

First Embodiment

FIG. 1 is a diagram illustrating a configuration example of a semiconductor storage device 1 according to a first embodiment. The semiconductor storage device 1 according to the present embodiment is, for example, a DRAM including a memory cell array MCA in which memory cells MC are arrayed two-dimensionally (planarly) or three-dimensionally (sterically). A two-dimensional memory cell array MCA will be explained in the present embodiment. Each of the memory cells MC is used as a memory cell that stores one-bit data or multi-bit data.

The memory cells MC are arrayed, for example, in a matrix planarly in an X-Y plane and constitute the two-dimensional memory cell array MCA.

The semiconductor storage device 1 according to the present embodiment includes the memory cell array MCA, a plurality of word lines WL, a plurality of bit lines BL, a row decoder RD, a word line driver WD, a sense amplifier circuit SA, and a controller CTL. The semiconductor storage device 1 is configured as one semiconductor chip.

The word lines WL extend in an X direction in the memory cell array MCA and are each connected to a plurality of memory cells MC arrayed in the X direction. In the memory cell array MCA, the word lines WL are arrayed in a Y direction. One end of each of the word lines WL is connected to the word line driver WD or the row decoder RD.

The bit lines BL extend in the Y direction in the memory cell array MCA and are each connected to a plurality of memory cells MC arrayed in the Y direction. In the memory cell array MCA, the bit lines BL are arrayed in the X direction. One end of each of the bit lines BL is connected to the sense amplifier circuit SA.

The row decoder RD selects one word line WL from among the word lines WL in accordance with a row address from outside. The word line driver WD applies a write voltage or a read voltage to the selected word line WL.

In a read operation, the sense amplifier circuit SA detects data stored in selected memory cells MC connected to the selected word line WL via the bit lines BL. Alternatively, in a write operation, the sense amplifier circuit SA writes data into selected memory cells MC connected to the selected word line WL by applying a write voltage to the selected memory cells MC.

The controller CTL controls the word line driver WD, the row decoder RD, the sense amplifier circuit SA, and the like to write data into the memory cell array MCA or read data from the memory cell array MCA.

Each of the memory cells MC includes a cell transistor Tc and a cell capacitor Cc. The gate of the cell transistor Tc is connected to any of the word lines WL. One of the source and the drain of the cell transistor Tc is connected to one bit line BL and the other one is connected to one end of the cell capacitor Cc. The cell capacitor Cc is connected between the other of the source and the drain of the cell transistor Tc and a reference voltage source (for example, the ground).

Each of the memory cells MC can store logical data by accumulating charges in the cell capacitor Cc via the cell transistor Tc or emitting charges from the cell capacitor Cc.

In the semiconductor storage device 1 described above, the memory cell array MCA includes a plurality of sub arrays that are simultaneously driven in a read operation or a write operation. One set of word lines WL are provided for the sub arrays and are simultaneously driven in a read operation or a write operation. Data read from the sub arrays constitutes a page. A page is a unit of reading or writing data.

The row decoder RD selects a word line WL from one set of word lines WL in accordance with a row address. The word line driver WD applies a read voltage or a write voltage to the selected word line WL. When a read voltage or a write voltage is applied to the selected word line WL in this manner, memory cells MC connected to non-selected word lines WL adjacent to the selected word line WL are electrically affected due to the proximity effect. When a same word line WL is repeatedly selected, data in memory cells MC connected to word lines WL adjacent to the selected word line WL are repeatedly disturbed and are deteriorated. As a result, the data in the memory cells MC is logically inverted in some cases.

In such cases, it is conceivable that the controller CTL corrects error bits using error correction with the ECC. However, the number of bits that can be corrected with the ECC is limited and the error bits cannot be corrected with the ECC if the number of bits is large.

Figure 2:
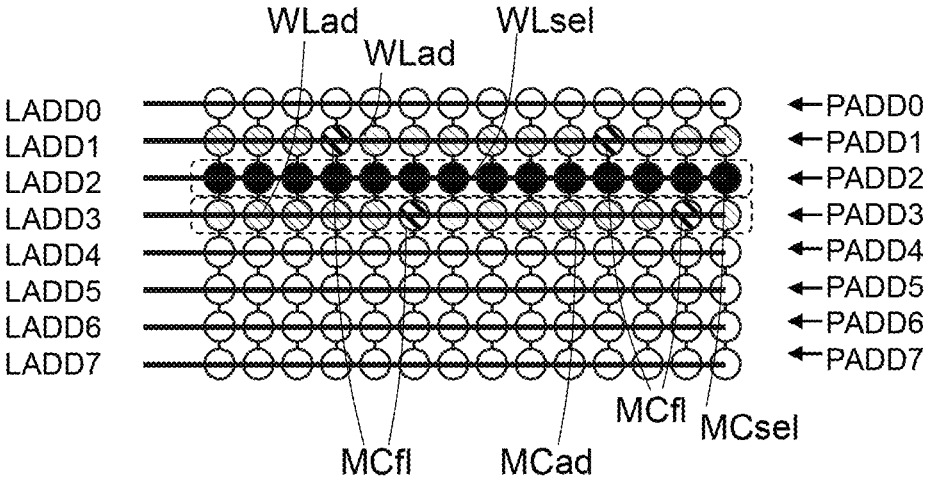
FIG. 2 is a conceptual diagram illustrating a correspondence relation between physical row addresses and logical row addresses of sub arrays according to a comparative example.
Figure 2:
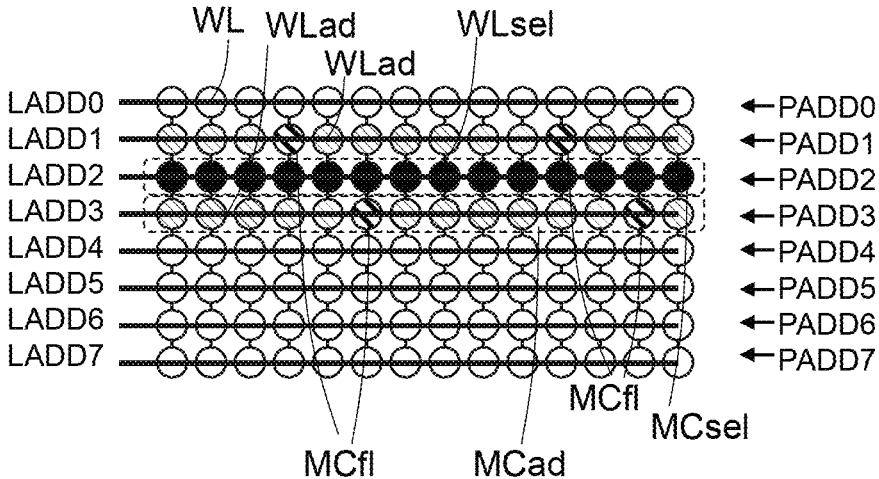

For example, FIG. 2 is a conceptual diagram illustrating a correspondence relation between physical row addresses and logical row addresses of sub arrays Sub1 and Sub2 according to a comparative example. In this comparative example, a common logical row address is set to each of physical rows in the sub arrays Sub1 and Sub2. Therefore, logical row addresses of physical rows adjacent to a certain physical row are the same in the sub array Sub1 and the sub array Sub2. A physical row is a line of memory cells MC arrayed in the X direction along each of the word lines WL in the memory cell array MCA. A physical row address is an address unique to each physical row. A word line WL is connected to memory cells MC corresponding to each of the physical rows. Therefore, each word line WL also corresponds to a physical row address.

Physical row addresses PADD0 to PADD7 of the sub arrays Sub1 and Sub2 are numbered starting from a top-end physical row in FIG. 2. The physical row addresses PADD0 to PADD7 are unique physical row addresses assigned to the physical rows in the sub arrays Sub1 and Sub2.

Logical row addresses LADD0 to LADD7 are freely set to the physical row addresses PADD0 to PADD7 in the sub arrays Sub1 and Sub2. The logical row addresses LADD0 to LADD7 are addresses that can be freely set to the physical row addresses PADD0 to PADD7. While the physical row addresses PADD0 to PADD7 cannot be changed with respect to the physical rows, the logical row addresses LADD0 to LADD7 can be relatively changed with respect to the physical rows or the physical row addresses PADD0 to PADD7. That is, the correspondence relation between the logical row addresses LADD0 to LADD7 and the physical row addresses PADD0 to PADD7 can be changed.

In a read operation or a write operation, the row decoder RD selects a selection word line WLsel of a physical row address PADDm (m=any of 0 to 7) corresponding to a logical row address LADDk (k=any of 0 to 7) from outside. This enables data to be read from selected memory cells MCsel connected to the selection word line WLsel, or enables data to be written into the selected memory cells MCsel.

In the comparative example, the correspondence relation of the logical row address LADDk to the physical row address PADDm in the sub array Sub1 is the same as that of the logical row address LADDk to the physical row address PADDm in the sub array Sub2. The common correspondence relation of the logical row address LADDk to the physical row address PADDm is set in the sub arrays Sub1 and Sub2. That is, when the logical row address LADDk is set to the physical row address PADDm in the sub array Sub1, the same logical row address LADDk is also set to the physical row address PADDm in the sub array Sub2. Particularly in the example of FIG. 2, k=m is established in the sub arrays Sub1 and Sub2.

For example, when the logical row address LADD2 is selected in a read operation or a write operation, the word line WL of the physical row address PADD2 corresponding to the logical row address LADD2 is the selection word line WLsel. Memory cells MCad connected to word lines WLad of two physical row addresses PADD1 and PADD3 adjacent to the physical row address PADD2 are electrically affected due to the proximity effect.

When the logical row address LADD2 is repeatedly selected, the memory cells MCad connected to the two word lines WLad adjacent to the logical row address LADD2 are repeatedly disturbed. Further, among the memory cells MCad, memory cells MCfl (error bits) in which data is inverted may be produced. These error bits can be corrected to some extent using the error correction with the ECC. However, when the number of error bits is large, such error bits cannot be corrected with the ECC.

For example, as illustrated in FIG. 2, it is assumed that data in four memory cells MCfl in the two adjacent word lines WLad in each of the sub arrays Sub1 and Sub2 is inverted due to the proximity effect and has become error bits. In this case, when the logical row address LADD1 or LADD3 is selected in the next read operation, the physical row address PADD1 or PADD3 adjacent to the physical row address PADD2 is selected in the sub arrays Sub1 and Sub2. Therefore, the four error bits are included in either the logical row address LADD1 or LADD3. Accordingly, error correction of read data cannot be performed with the ECC in some cases.

In contrast thereto, in the present embodiment, setting of the logical row address LADDk to the physical row address PADDm differs according to the sub arrays Sub1 and Sub2. For example, the logical row addresses of physical rows adjacent to a certain physical row differ according to the sub arrays Sub1 and Sub2.

Figure 3:
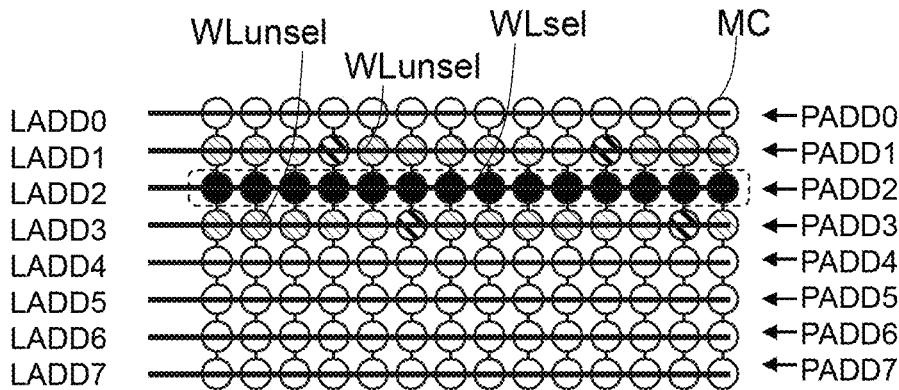
FIG. 3 is a conceptual diagram illustrating a correspondence relation between a physical row address and a logical row address of sub arrays according to the first embodiment.
Figure 3:
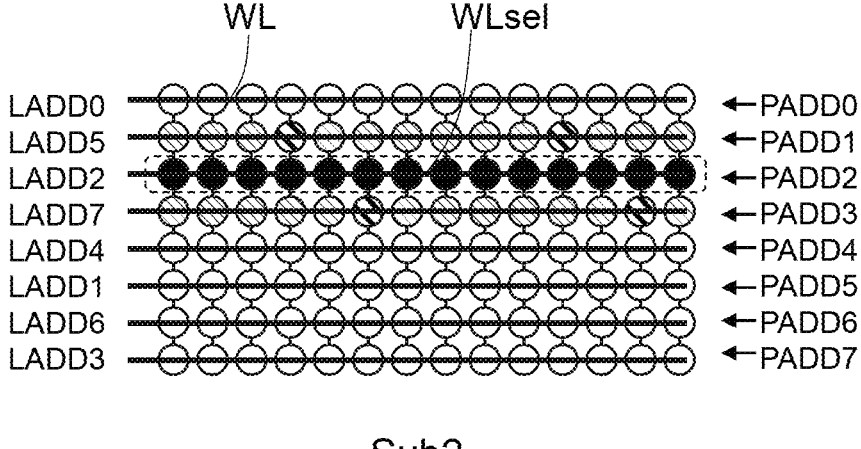
Figure 4:
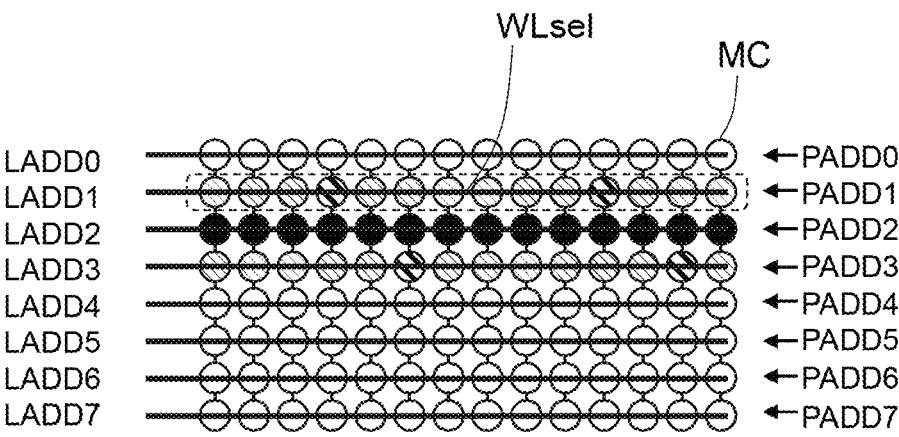
FIG. 4 is a conceptual diagram illustrating a correspondence relation between a physical row address and a logical row address of sub arrays according to the first embodiment.
Figure 4:
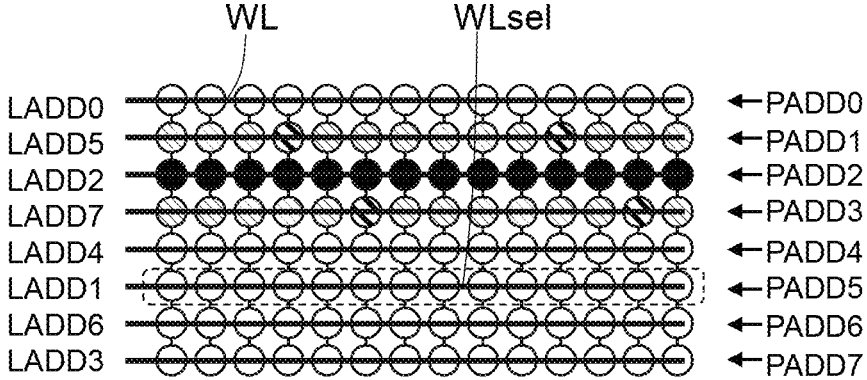

FIGS. 3 and 4 are conceptual diagrams illustrating correspondence relations between the physical row address and the logical row address of the sub arrays Sub1 and Sub2 according to the first embodiment. In the present embodiment, the logical row addresses LADD0 to LADD7 corresponding to physical rows adjacent to a certain physical row differ between the sub array Sub1 and the sub array Sub2.

The physical row addresses PADD0 to PADD7 in each of the sub arrays Sub1 and Sub2 are numbered starting from a top-end physical row in FIG. 3. In the sub array Sub1, the logical row addresses corresponding to the physical row addresses PADD0 to PADD7 are set to LADD0 to LADD7, respectively.

Meanwhile, in the sub array Sub2, the logical row addresses corresponding to the physical row addresses PADD0 to PADD7 are set to LADD0, LADD5, LADD2, LADD7, LADD4, LADD1, LADD6, and LADD3, respectively. In this way, the logical row addresses LADD0 to LADD7 of physical rows adjacent to a certain physical row differ between the sub array Sub1 and the sub array Sub2. For example, in the sub array Sub1, the logical row addresses corresponding to the physical row address PADD1 and PADD3 adjacent to the physical row address PADD2 are LADD1 and LADD3. Meanwhile, in the sub array Sub2, the logical row addresses corresponding to the physical row addresses PADD1 and PADD3 adjacent to the physical row address PADD2 are LADD5 and LADD7. Also with respect to other physical row addresses, the logical row addresses corresponding to adjacent physical row addresses differ according to the sub arrays Sub1 and Sub2.

For example, when the logical row address LADD2 is selected in a read operation or a write operation, the word line WL of the physical row address PADD2 corresponding to the logical row address LADD2 is the selection word line WLset. Memory cells MCad connected to word lines WLad of two physical row addresses PADD1 and PADD3 adjacent to the physical row address PADD2 are electrically affected due to the proximity effect.

When the logical row address LADD2 is repeatedly selected, the memory cells MCad connected to the adjacent two word lines WLad are repeatedly disturbed. Further, among the memory cells MCad, memory cells MCfl (error bits) in which data is inverted are produced in some cases.

However, in the present embodiment, the logical row addresses corresponding to the physical row addresses PADD1 and PADD3 adjacent to the selected physical row address PADD2 differ between the sub array Sub1 and the sub array Sub2. In the sub array Sub1, the logical row addresses corresponding to the physical row addresses PADD1 and PADD3 are LADD1 and LADD3. In the sub array Sub2, the logical row addresses corresponding to the physical row addresses PADD1 and PADD3 are LADD5 and LADD7.

For example, as illustrated in FIG. 3, it is assumed that data in four memory cells MCfl is inverted due to the proximity effect and become error bits in the two adjacent word lines WLad in each of the sub arrays Sub1 and Sub2. As illustrated in FIG. 4, when the logical row address LADD1 is selected in the next read operation, the word line WL corresponding to the physical row address PADD1 is a selected word line in the sub array Sub1. In the sub array Sub2, a word line WL corresponding to the physical row address PADD5 is a selected word line. When there is no error bit in the physical row address PADD5, the read data includes only the two error bits included in the physical row address PADD1. In this case, the possibility of success of the error correction with the ECC is high. This is because the logical row addresses corresponding to physical rows adjacent to a certain physical row differ according to the sub arrays Sub1 and Sub2 and error bits are accordingly dispersed in terms of the logical row addresses for each of the sub arrays Sub1 and Sub2.

As described above, according to the present embodiment, logical row addresses corresponding to physical rows adjacent to a certain physical row differ according to sub arrays. Accordingly, the possibility of error correction can be increased even if data in memory cells has an error due to interference between adjacent word lines. The logical row addresses may differ according to the sub arrays in all the sub arrays, or may differ only in some of the sub arrays. That is, it is possible that the logical row addresses differ among some of all the sub arrays and are common in the remaining sub arrays.

Second Embodiment

Figure 5:
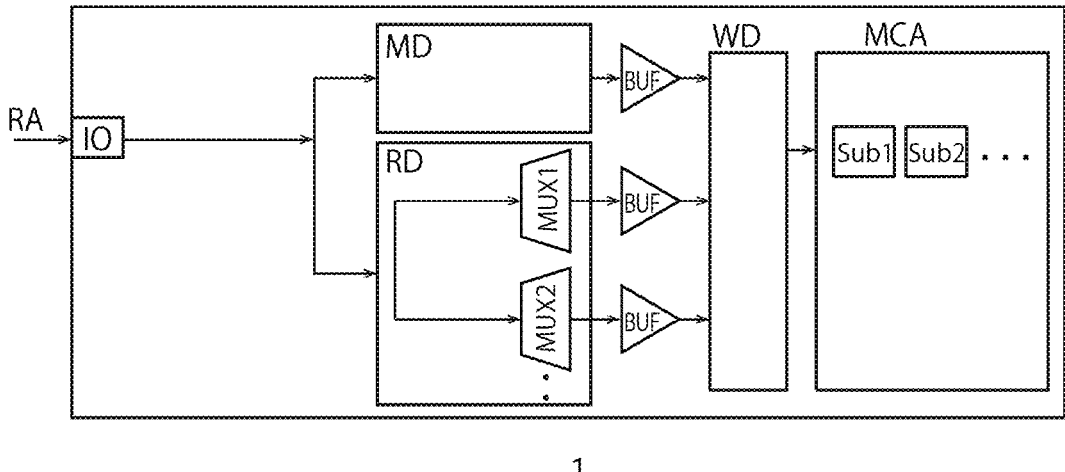
FIG. 5 is a block diagram illustrating a configuration example of a driving part for word lines of a semiconductor storage device according a second embodiment.

FIG. 5 is a block diagram illustrating a configuration example of a driving part for the word lines WL of the semiconductor storage device 1 according a second embodiment. The semiconductor storage device 1 includes an interface circuit IO, the row decoder RD, a main word line decoder MD, the word line driver WD, and the memory cell array MCA.

The interface circuit IO receives a row address RA from outside and transfers the row address RA to the main word line decoder MD and the row decoder RD.

The main word line decoder MD selects a plurality of sub arrays to be simultaneously driven in a write operation or a read operation in accordance with the row address RA. A set of word lines WL corresponding to the sub arrays simultaneously driven in a write operation or a read operation are connected in common to one main word line MWL. The main word line decoder MD selectively drives one main word line MWL from among a plurality of main word lines MWL. Accordingly, one set of word lines WL to be simultaneously driven and sub arrays corresponding to the set of word lines WL are selected. The main word line decoder MD is connected to the word line driver WD via a buffer BUF. The word line driver WD applies a voltage to the main word line MWL in the memory cell array MCA in accordance with an output of the main word line decoder MD.

The row decoder RD selects one word line WL in accordance with the logical row address LADDk of the row address RA from one set of word lines WL selected by the main word line decoder MD. That is, the row decoder RD selects a word line WL corresponding to a physical row that is set in each of the sub arrays Sub1 and Sub2 in accordance with the logical row address LADDk. In order to realize this function, the row decoder RD includes a plurality of multiplexers MUX1 and MUX2. The row decoder RD may include three or more multiplexers.

The multiplexers MUX1 and MUX2 are set for the sub arrays Sub1 and Sub2, respectively, and select physical row addresses PADDm different from each other with respect to a same logical row address LADDk. An output voltage of the multiplexer MUX1 is applied to the word lines WL of the sub array Sub1 via the buffer BUF and the word line driver WD. The word line driver WD applies the voltage to the word lines WL of the sub array Sub1 in accordance with the output of the multiplexer MUX1. An output voltage of the multiplexer MUX2 is applied to the word lines WL of the sub array Sub2 via the buffer BUF and the word line driver WD. The word line driver WD applies the voltage to the word lines WL of the sub array Sub2 in accordance with the output of the multiplexer MUX2.

Figure 6:
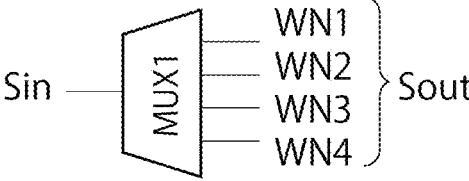
FIG. 6 is a diagram illustrating a logic of an input signal and an output signal of each of multiplexers.
Figure 7:
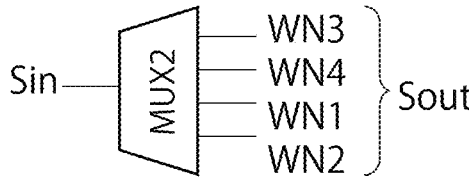
FIG. 7 is a diagram illustrating a logic of an input signal and an output signal of each of the multiplexers.

FIGS. 6 and 7 are diagrams illustrating logics of an input signal Sin and an output signal Sout of each of the multiplexers MUX1 and MUX2. FIG. 8 is an example of a truth value table of the input signal Sin and the output signal Sout of each of the multiplexers MUX1 and MUX2. For the sake of convenience, each of the multiplexers MUX1 and MUX2 outputs an output signal of four bits in response to the input signal Sin in FIGS. 6 to 8. However, each of the multiplexers MUX1 and MUX2 may output an output signal of three or less bits, or five or more bits in response to the input signal Sin.

The multiplexers MUX1 and MUX2 illustrated in FIGS. 6 and 7 receive the same logical row address LADDk as the input signal Sin. At this time, the multiplexer MUX1 outputs an output signal of four bits (WN1, WN2, WN3, WN4). The four bits (WN1, WN2, WN3, WN4) of the output signal from the multiplexer MUX1 are output to four word lines WL of the sub array Sub1, respectively. The multiplexer MUX2 outputs an output signal of four bits (WN3, WN4, WN1, WN2). The four bits (WN3, WN4, WN1, WN2) of the output signal from the multiplexer MUX2 are output to four word lines WL of the sub array Sub2, respectively.

For example, as illustrated in FIG. 8, it is assumed that the input signal Sin (the logical row address) is two-bit data and that the output signal Sout is output as four-bit data. When the input signal is 00, the bits WN1, WN2, WN3, and WN4 of the output signal of the multiplexer MUX1 are 0, 0, 0, and 1, respectively. That is, the output signal Sout (WN1, WN2, WN3, WN4) of the multiplexer MUX1 is (0001). In this case, a word line WL corresponding to the bit WN4 of the output signal is driven as the selection word line WLsel. Meanwhile, the output signal Sout (WN3, WN4, WN1, WN2) of the multiplexer MUX2 is (0100) and a word line WL corresponding to the bit WN4 of the output signal is driven as the selection word line WLsel. Therefore, the fourth word line WL is the selection word line WLsel in the sub array Sub1 and the second word line WL is the selection word line WLsel in the sub array Sub2.

When the input signal is 01, the bits WN1, WN2, WN3, and WN4 of the output signal of the multiplexer MUX1 are 0, 0, 1, and 0, respectively. That is, the output signal Sout (WN1, WN2, WN3, WN4) of the multiplexer MUX1 is (0010). In this case, a word line WL corresponding to the bit WN3 of the output signal is driven as the selection word line WLsel. Meanwhile, the output signal Sout (WN3, WN4, WN1, WN2) of the multiplexer MUX2 is (1000) and a word line WL corresponding to the bit WN1 of the output signal is driven as the selection word line WLsel. Therefore, the third word line WL is the selection word line WLsel in the sub array Sub1 and the first word line WL is the selection word line WLsel in the sub array Sub2.

When the input signal is 10, the bits WN1, WN2, WN3, and WN4 of the output signal of the multiplexer MUX1 are 0, 1, 0, and 0, respectively. That is, the output signal Sout (WN1, WN2, WN3, WN4) of the multiplexer MUX1 is (0100). In this case, a word line WL corresponding to the bit WN2 of the output signal is driven as the selection word line WLsel. Meanwhile, the output signal Sout (WN3, WN4, WN1, WN2) of the multiplexer MUX2 is (0001) and a word line WL corresponding to the bit WN4 of the output signal is driven as the selection word line WLsel. Therefore, the second word line WL is the selection word line WLsel in the sub array Sub1 and the fourth word line WL is the selection word line WLsel in the sub array Sub2.

When the input signal is 11, the bits WN1, WN2, WN3, and WN4 of the output signal of the multiplexer MUX1 are 1, 0, 0, and 0, respectively. That is, the output signal Sout (WN1, WN2, WN3, WN4) of the multiplexer MUX1 is (1000). In this case, a word line WL corresponding to the bit WN1 of the output signal is driven as the selection word line WLsel. Meanwhile, the output signal Sout (WN3, WN4, WN1, WN2) of the multiplexer MUX2 is (0010) and a word line WL corresponding to the bit WN3 of the output signal is driven as the selection word line WLsel. Therefore, the first word line WL is the selection word line WLsel in the sub array Sub1 and the third word line WL is the selection word line WLsel in the sub array Sub2.

As described above, in the present embodiment, the word line WL selected by a same logical row address differs according to the sub arrays. In order to enable the logical row addresses LADD0 to LADD7 illustrated in FIG. 4 to be output as the output signal as in the first embodiment, it suffices that the input signal Sin is three-bit data and that the output signal Sout is an eight-bit output signal.

Figure 9:
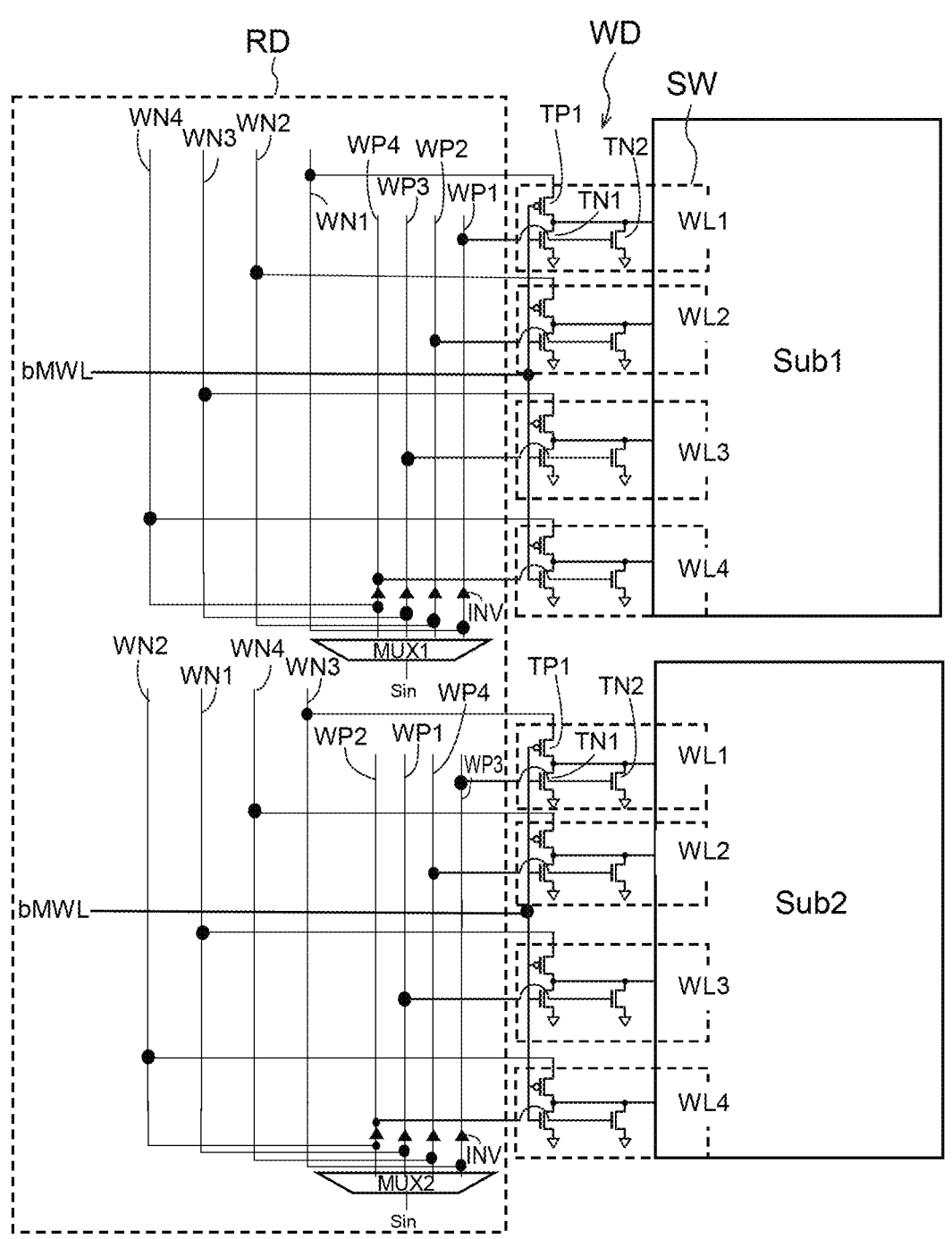
FIG. 9 is a diagram illustrating a configuration example of a row decoder and a word line driver using the multiplexers.

FIG. 9 is a diagram illustrating a configuration example of the row decoder RD and the word line driver WD using the multiplexers MUX1 and MUX2. The multiplexers MUX1 and MUX2 are provided for the sub arrays Sub1 and Sub2, respectively. Each of the multiplexers MUX1 and MUX2 outputs the output signals WN1 to WN4 in response to the input signal Sin as illustrated in FIGS. 6 and 7. Output signals WP1 to WP4 are inversion signals of the output signals WN1 to WN4, respectively. An inverter INV inverts the output signals WN1 to WN4 of each of the multiplexers MUX1 and MUX2 to output the output signals WP1 to WP4.

The word line driver WD receives a selection signal bMWL for a main word line and selects a plurality of sub arrays Sub1 and Sub2 to be simultaneously driven (corresponding to one page) in a read operation or a write operation. The selection signal bMWL is a low-active signal that is brought to a selected state when it is logically low. The word line driver WD applies a read voltage or a write voltage to the word lines WL1 to WL4 of each of the sub arrays Sub1 and Sub2 in accordance with the output signals WN1 to WN4 and WP1 to WP4.

The word line driver WD includes a switch circuit SW provided with respect to each of the word lines WL1 to WL4 in each of the sub arrays Sub1 and Sub2. Each of the switch circuits SW includes a p-type transistor TP1 and n-type transistors TN1 and TN2. The switch circuits SW have a same configuration for the word lines WL1 to WL4. Therefore, the configuration of one switch circuit SW will be explained and explanations of other switch circuits SW are omitted.

The transistor TP1 is connected between the signal line for any of the output signals WN1 to WN4 and any of the word lines WL1 to WL4. The gate of the transistor TP1 is connected to the main word line and receives the selection signal bMWL.

The transistors TN1 and TN2 are connected in parallel between any of the word lines WL1 to WL4 and a ground voltage source. The gate of the transistor TN1 is connected to the main word line in common to the gate of the transistor TP1 and receives the selection signal bMWL. The gate of the transistor TN2 is connected to the signal line for any of the output signals WP1 to WP4.

For example, when the selection signal bMWL is logically high, the sub arrays Sub1 and Sub2 are in a non-selected state. At this time, the transistors TP1 of the switch circuits SW are in a non-conduction state and the transistors TN1 are in a conduction state. Accordingly, all the word lines WL1 to WL4 in the sub arrays Sub1 and Sub2 are maintained at the ground voltage via the transistors TN1 regardless of the states of the output signals WN1 to WN4.

On the other hand, when the selection signal bMWL is logically low, the sub arrays Sub1 and Sub2 are brought to a selected state. At this time, the transistors TP1 of the switch circuits SW are brought to a conduction state and the transistors TN1 are brought to a non-conduction state. Accordingly, the word lines WL1 to WL4 of the sub arrays Sub1 and Sub2 are disconnected from the ground voltage in the transistors TN1. The signal lines for the output signals WN1 to WN4 are respectively connected to the word lines WL1 to WL4 of the sub arrays Sub1 and Sub2 via the transistors TP1. At this time, the switch circuits SW each apply a high-level voltage or a low-level voltage to the word lines WL according to the logics of the output signals WN1 to WN4 and WP1 to WP4.

As illustrated in FIG. 8, for example, when the input signal becomes 00 in a case in which the sub arrays Sub1 and Sub2 are in a selected state, the output signals WN1, WN2, WN3, and WN4 are 0, 0, 0, and 1, respectively. In this case, the word line WL4 is the selection word line WLsel and has a high-level voltage in the sub array Sub1, and the word line WL2 is the selection word line WLsel and has a high-level voltage in the sub array Sub2. Other word lines are maintained at a low-level voltage.

When the input signal is 01, the bits WN1, WN2, WN3, and WN4 of the output signal are 0, 0, 1, and 0, respectively. In this case, the word line WL3 is the selection word line WLsel and has a high-level voltage in the sub array Sub1, and the word line WL1 is the selection word line WLsel and has a high-level voltage in the sub array Sub2. Other word lines are maintained at a low-level voltage.

When the input signal is 10, the bits WN1, WN2, WN3, and WN4 of the output signal are 0, 1, 0, and 0, respectively. In this case, the word line WL2 is the selection word line WLsel and has a high-level voltage in the sub array Sub1, and the word line WL4 is the selection word line WLsel and has a high-level voltage in the sub array Sub2. Other word lines are maintained at a low-level voltage.

When the input signal is 11, the bits WN1, WN2, WN3, and WN4 of the output signal are 1, 0, 0, and 0, respectively. In this case, the word line WL1 is the selection word line WLsel and has a high-level voltage in the sub array Sub1, and the word line WL3 is the selection word line WLsel and has a high-level voltage in the sub array Sub2. Other word lines are maintained at a low-level voltage.

As described above in the second embodiment, as illustrated in FIGS. 6 to 8, the multiplexers MUX1 and MUX2 are configured to be different from each other to cause the output signals to differ with respect to the input signal Sin. Accordingly, in the second embodiment, even when the arrangement of the lines for the output signals WN1 to WN4 and WP1 to WP4, and the connection relation between the word line driver WD and the row decoder RD are the same, the output signals WL1 to WN4, that is, the logical row addresses can be caused to differ according to the sub arrays Sub1 and Sub2. As a result, the possibility of error correction can be increased even if data in memory cells has an error due to interference between adjacent word lines.

Third Embodiment

Figure 10:
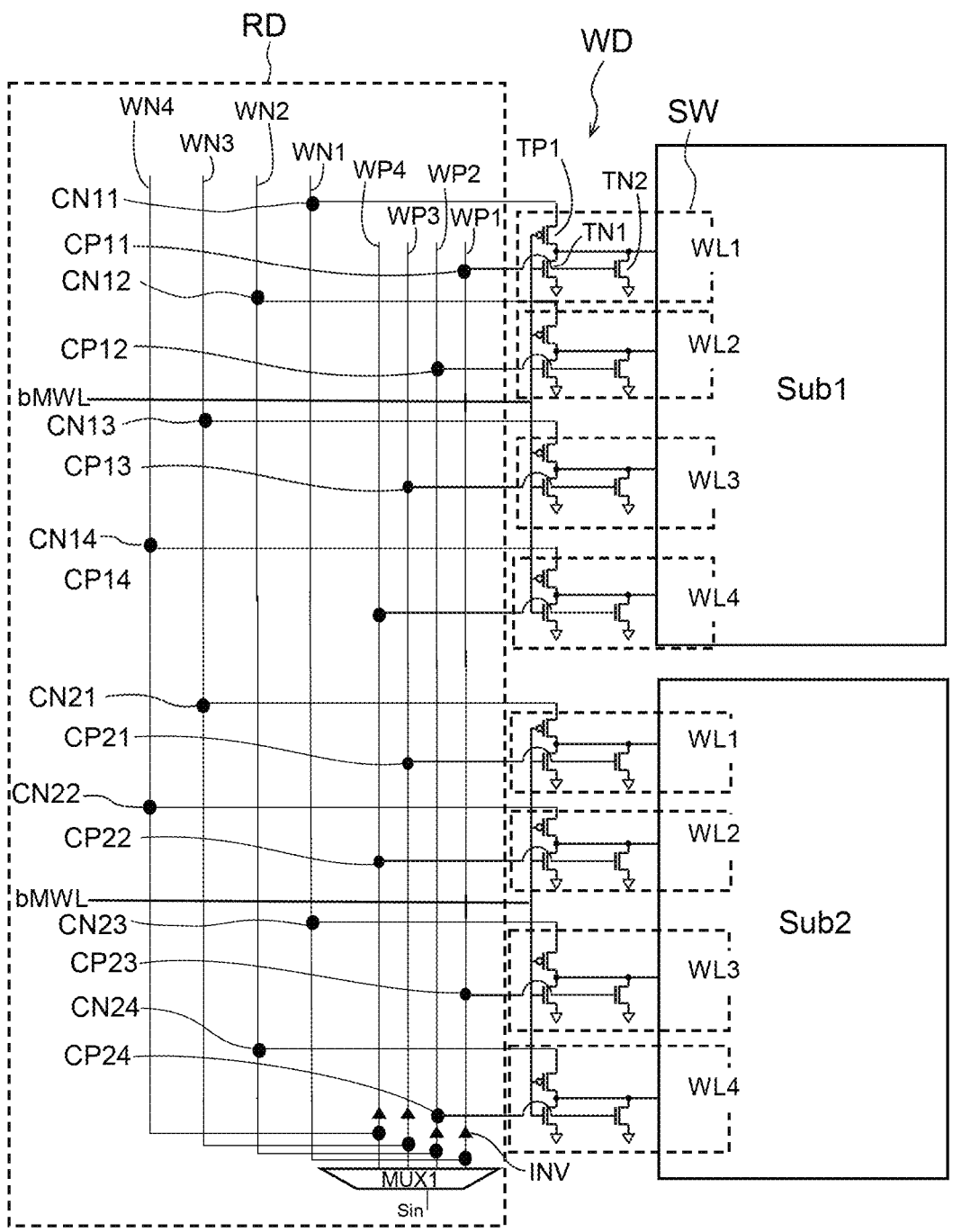
FIG. 10 is a diagram illustrating a configuration example of a row decoder and a word line driver using multiplexers according to a third embodiment.

FIG. 10 is a diagram illustrating a configuration example of the row decoder RD and the word line driver WD using the multiplexers MUX1 according to a third embodiment. In the third embodiment, lines for the output signals WN1 to WN4 and WP1 to WP4 are common to the sub arrays Sub1 and Sub2 corresponding to one page. With this configuration, the multiplexer MUX1 is also common to the sub arrays Sub1 and Sub2 corresponding to one page. On the other hand, in the third embodiment, the connection relation between the row decoder RD and the word line driver WD differs according to the sub arrays Sub1 and Sub2.

For example, in the sub array Sub1, the lines for the output signals WN1 to WN4 are connected to the switch circuits SW corresponding to the word lines WL1 to WL4 via contacts CN11 to CN14, respectively. The lines for the output signals WP1 to WP4 are connected to the switch circuits SW corresponding to the word lines WL1 to WL4 via contacts CP11 to CP14, respectively.

In the sub array Sub1, the contacts CN11 to CN14 and CP11 to CP14 connect between the output of the multiplexer MUX1 and the word lines WL1 to WL4 of the sub array Sub1. More specifically, the contacts CN11 to CN14 and CP11 to CP14 connect between the output of the multiplexer MUX1 and the inputs of the word line driver WD of the sub array Sub1.

Meanwhile, in the sub array Sub2, the line for the output signal WN1 is connected to the switch circuit SW corresponding to the word line WL3 via a contact CN23. The line for the output signal WN2 is connected to the switch circuit SW corresponding to the word line WL4 via a contact CN24. The line for the output signal WN3 is connected to the switch circuit SW corresponding to the word line WL1 via a contact CN21. The line for the output signal WN4 is connected to the switch circuit SW corresponding to the word line WL2 via a contact CN22.

The line for the output signal WP1 is connected to the switch circuit SW corresponding to the word line WL3 via a contact CP23. The line for the output signal WP2 is connected to the switch circuit SW corresponding to the word line WL4 via a contact CP24. The line for the output signal WP3 is connected to the switch circuit SW corresponding to the word line WL1 via a contact CP21. The line for the output signal WP4 is connected to the switch circuit SW corresponding to the word line WL2 via a contact CP22.

In the sub array Sub2, the contacts CN21 to CN24 and CP21 to CP24 connect between the output of the multiplexer MUX1 and the word lines WL1 to WL4 of the sub array Sub2. More specifically, the contacts CN21 to CN24 and CP21 to CP24 connect between the output of the multiplexer MUX1 and the inputs of the word line driver WD of the sub array Sub2.

As described above, the contacts CN11 to CN24 and CP11 to CP24 connect the bits of the logical row address to the word lines WL1 to WL4 corresponding to the physical rows differing according to the sub arrays Sub1 and Sub2.

The contacts CN11 to CN24 and CP11 to CP24 may be included in either the row decoder RD or the word line driver WD.

Other configurations of the third embodiment may be identical to corresponding configurations of the second embodiment.

As illustrated in FIGS. 6 and 8, the multiplexer MUX1 outputs the output signals WN1 to WN4 for selecting a physical row in response to the input signal Sin as a logical row address. While the multiplexer MUX1 is common to the sub arrays Sub1 and Sub2, the positional relation (the connection relation) of the contacts CN11 to CN24 and CP11 to CP24 to the word lines WL1 to WL4 differs according to the sub arrays Sub1 and Sub2. That is, the positions (connections) of the contacts CN11 to CN24 and CP11 to CP24 between the lines for the output signals WN1 to WN4 and WP1 to WP4 of the row decoder RD and the switch circuits SW of the word line driver WD differ according to the sub arrays Sub1 and Sub2.

This enables the output signals WN1 to WN4 to be transmitted to the word lines WL1 to WL4 differing according to the sub arrays Sub1 and Sub2. That is, also in the third embodiment, the logical row address can be caused to differ according to the sub arrays Sub1 and Sub2.

In the third embodiment, since the multiplexer MUX1 is common to the sub arrays Sub1 and Sub2, the circuit scale of the row decoder RD can be decreased.

In the third embodiment, the positions (connections) of the contacts CN11 to CN24 and CP11 to CP24 are caused to differ according to the sub arrays Sub1 and Sub2, whereby the row decoder RD transmits the logical row address (the output signals WN1 to WN4) to the word lines WL1 to WL4 differing according to the sub arrays Sub1 and Sub2. However, the row decoder RD may transmit the logical row address (the output signals WN1 to WN4) to the word lines WL1 to WL4 differing according to the sub arrays Sub1 and Sub2 with intersecting the lines for the output signals WN1 to WN4 while maintaining electrical insulation thereof.

Fourth Embodiment

Figure 11:
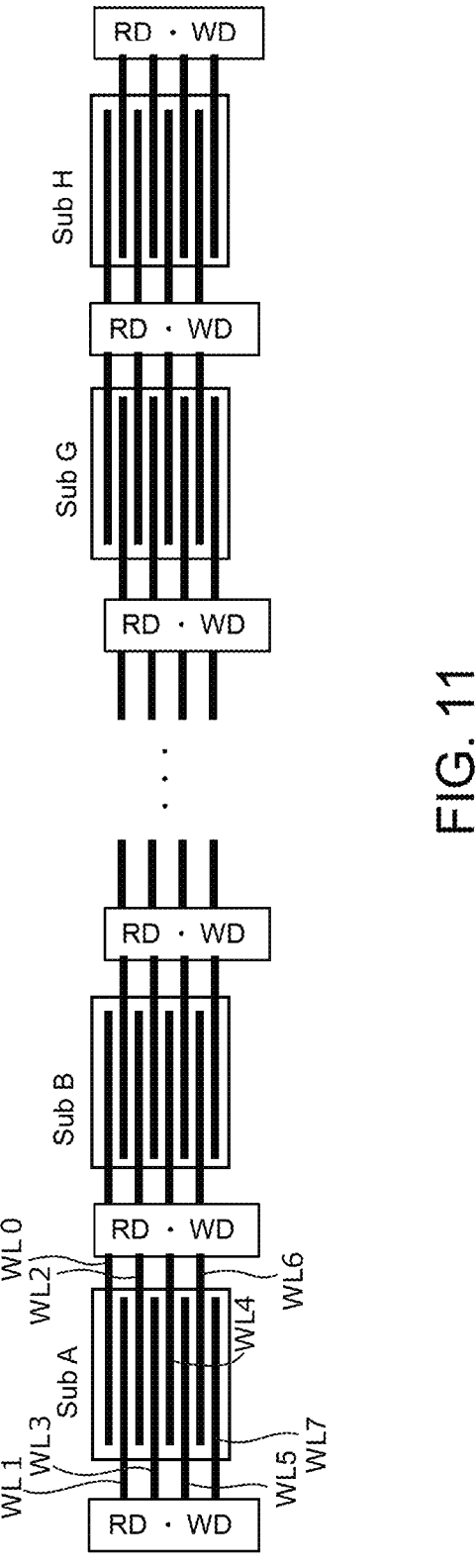
FIG. 11 is a block diagram illustrating a configuration of sub arrays according to a fourth embodiment.

FIG. 11 is a block diagram illustrating a configuration of sub arrays SubA to SubH according to a fourth embodiment. The eight sub arrays SubA to SubH correspond to one page and are simultaneously driven in a read operation or a write operation.

In the fourth embodiment, the row decoder RD and the word line driver WD are provided on both sides of each of the sub arrays SubA to SubH. The row decoders RD and the word line drivers WD are each connected to halves of word lines WL from the both sides of each of the sub arrays SubA to SubH and drive the connected word lines WL. For example, the row decoder RD and the word line driver WD of one side of the sub array SubA are connected to four word lines WL1, WL3, WL5, and WL7 and the row decoder RD and the word line driver WD of the other side are connected to four word lines WL0, WL2, WL4, and WL6. With this configuration of the sub arrays SubA to SubH, the row decoder RD and the word line driver WD can drive the eight sub arrays SubA to SubH each having eight word lines WL0 to WL7.

FIG. 12 is a table illustrating a correspondence relation between the word lines WL0 to WL7 and the logical row addresses LADD0 to LADD7 of the sub arrays SubA to SubH according to the fourth embodiment. In FIG. 12, "LADD" of the logical row addresses LADD0 to LADD7 is omitted and only numerals thereof are illustrated.

In the fourth embodiment, each of even-numbered logical row addresses LADD0, LADD2, LADD4, and LADD6 is set to word lines WL1, WL3, WL5, and WL7 different according to the sub arrays SubA to SubD. Odd-numbered logical row addresses LADD1, LADD3, LADD5, and LADD7 are each common to the sub arrays SubA to SubD and are set to the same word lines WL6, WL4, WL2, and WL0, respectively.

For example, in the sub array SubA, the word lines WL0 to WL7 are set to the logical row addresses LADD7, LADD6, LADD5, LADD4, LADD3, LADD2, LADD1, and LADD0, respectively.

In the sub array SubB, the word lines WL0 to WL7 are set to the logical row addresses LADD7, LADD4, LADD5, LADD2, LADD3, LADD0, LADD1, and LADD6, respectively.

In the sub array SubC, the word lines WL0 to WL7 are set to the logical row addresses LADD7, LADD2, LADD5, LADD0, LADD3, LADD6, LADD1, and LADD4, respectively.

In the sub array SubD, the word lines WL0 to WL7 are set to the logical row addresses LADD7, LADD0, LADD5, LADD6, LADD3, LADD4, LADD1, and LADD2, respectively.

The sub arrays SubE to SubH are set in the same manner as the sub arrays SubA to SubD, respectively.

In this case, for example, when the logical row address LADD1 is selected, the word lines WL5 and WL7 corresponding to a physical row adjacent to the selected word line WL6 are disturbed. The logical row addresses corresponding to the word lines WL5 and WL7 are different from each other in the sub arrays SubA to SubD and are also different from each other in the sub arrays SubE to SubH. Therefore, even when error bits are produced, these error bits are dispersed over various logical row addresses.

When the logical row address LADD6 is selected, the physical row (the word line WL) corresponding to the physical row address LADD6 differs from each other in the sub arrays SubA to SubD and also differs from each other in the sub arrays SubE to SubH. Therefore, also in this case, even when error bits are produced, these error bits are dispersed over various logical row addresses.

As described above, also in the fourth embodiment, the logical row addresses corresponding to physical rows (word lines WL) adjacent to a certain physical row (a word line WL) are enabled to differ according to the sub arrays SubA to SubD (or SubE to SubH). As a result, the possibility of error correction can be increased even if data in memory cells has an error due to interference between adjacent word lines.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a memory cell array comprising first and second sub arrays respectively including a plurality of memory cells and simultaneously driven in a read operation or a write operation;
a plurality of first lines each connected to the plurality of memory cells corresponding to one of a plurality of physical rows, where the physical row corresponds to the memory cells arranged in a first direction in the memory cell array;
a plurality of second lines each connected to the plurality of memory cells arranged in a second direction intersecting with the first direction in the memory cell array;
a decoder configured to select a selection line from among the first lines in accordance with a logical row address corresponding to each of the physical rows and to apply a read voltage or a write voltage to the selection line; and
a sense amplifier configured to detect data from the second lines, wherein logical row addresses corresponding to physical rows adjacent to a certain physical row among the plurality of physical rows are fixed to differ between the first sub array and the second sub array, such that error bits are dispersed in terms of the logical row addresses for each of the first and second sub arrays.

2. The device of claim 1, wherein the decoder selects one of the first lines corresponding to one of the physical rows set for each of the first and second sub arrays in accordance with the logical row address.

3. The device of claim 1, wherein the decoder comprises first and second selection circuits respectively provided in the first and second sub arrays and configured to output a physical row address for selecting different ones of the physical rows with respect to a same one of the logical row addresses.

4. The device of claim 2, wherein the decoder comprises first and second selection circuits respectively provided in the first and second sub arrays and configured to output a physical row address for selecting different ones of the physical rows with respect to a same one of the logical row addresses.

5. The device of claim 1, wherein
the decoder further comprises:
a selection circuit provided in common to the first and second sub arrays and configured to output a physical row address for selecting a certain physical row with respect to a same one of the logical row addresses; and
a connection part configured to connect between an output of the selection circuit and the first lines of the first and second sub arrays and to input a bit of the physical row address to the first lines corresponding to the physical rows differing between the first sub array and the second sub array.

6. The device of claim 2, wherein
the decoder further comprises:
a selection circuit provided in common to the first and second sub arrays and configured to output a physical row address for selecting a certain physical row with respect to a same one of the logical row addresses; and
a connection part configured to connect between an output of the selection circuit and the first lines of the first and second sub arrays and to input a bit of the physical row address to the first lines corresponding to the physical rows differing between the first sub array and the second sub array.

7. The device of claim 5, further comprising a driver provided between the decoder and the first and second sub arrays and configured to apply a voltage to the first lines in accordance with the logical row address.

8. The device of claim 6, further comprising a driver provided between the decoder and the first and second sub arrays and configured to apply a voltage to the first lines in accordance with the logical row address.

9. The device of claim 7, wherein the connection part is a contact configured to connect between the output of the selection circuit and an input of the driver.

10. The device of claim 8, wherein the connection part is a contact configured to connect between the output of the selection circuit and an input of the driver.

11. The device of claim 1, wherein the first and second sub arrays correspond to the first lines to be simultaneously driven in a read operation or a write operation.

12. The device of claim 1, wherein the memory cell array is a DRAM (Dynamic Random Access Memory).

13. The device of claim 2, wherein the memory cell array is a DRAM.

14. The device of claim 1, wherein
the certain physical row corresponds to an identical logical row address between the first sub array and the second sub array, and
first and second physical rows adjacent to the certain physical row correspond to different logical row addresses between the first sub array and the second sub array.

* * * * *